United States Patent
Oka et al.

(10) Patent No.: US 10,134,515 B2
(45) Date of Patent: Nov. 20, 2018

(54) SUPERCONDUCTING MAGNET DEVICE AND METHOD FOR MANUFACTURING THE SAME

(71) Applicant: JAPAN SUPERCONDUCTOR TECHNOLOGY INC., Kobe-shi (JP)

(72) Inventors: Atsuko Oka, Kobe (JP); Shota Kanai, Kobe (JP)

(73) Assignee: JAPAN SEMICONDUCTOR TECHNOLOGY INC., Kobe-shi (JP)

( * ) Notice: Subject to any disclaimer, the term of this patent is extended or adjusted under 35 U.S.C. 154(b) by 54 days.

(21) Appl. No.: 15/470,187

(22) Filed: Mar. 27, 2017

(65) Prior Publication Data

US 2017/0294256 A1    Oct. 12, 2017

(30) Foreign Application Priority Data

Apr. 8, 2016  (JP) ................. 2016-077885

(51) Int. Cl.
*H01F 6/06*    (2006.01)
*H01F 6/04*    (2006.01)
*G01R 33/38*   (2006.01)

(52) U.S. Cl.
CPC .......... *H01F 6/06* (2013.01); *G01R 33/3802* (2013.01); *H01F 6/04* (2013.01)

(58) Field of Classification Search
CPC ..... H01F 6/00; H01F 6/04; H01F 6/06; H01F 6/065; G01R 33/3802; G01R 33/3804
See application file for complete search history.

(56) References Cited

U.S. PATENT DOCUMENTS

| | | | |
|---|---|---|---|
| 2005/0099181 A1* | 5/2005 | Motoshiromizu | G01R 33/3815 324/318 |
| 2013/0029849 A1 | 1/2013 | Wu et al. | |
| 2015/0072864 A1 | 3/2015 | Wu et al. | |

FOREIGN PATENT DOCUMENTS

JP    2013-31658    2/2013

* cited by examiner

*Primary Examiner* — Ramon M Barrera
(74) *Attorney, Agent, or Firm* — Oblon, McClelland, Maier & Neustadt, L.L.P

(57) ABSTRACT

A superconducting magnet device includes a vacuum container having a tubular barrel portion; a magnet assembly including a superconducting coil, a refrigerant tank, and a radiation shield, the magnet assembly being housed in the vacuum container; a supporting block fixed to the barrel portion and protruding beyond the barrel portion to the inside of the vacuum container; and a connecting portion which connects the magnet assembly and the supporting block to each other such that the magnet assembly is spaced apart from the barrel portion within the vacuum container. The connecting portion has thermal conductivity lower than thermal conductivity of the supporting member. The supporting member receives weight of the magnet assembly via the connecting portion while protruding inwardly beyond at least an outer circumference surface of the radiation shield of the magnet assembly.

15 Claims, 12 Drawing Sheets

SUPERCONDUCTING MAGNET DEVICE AND METHOD FOR MANUFACTURING THE SAME

TECHNICAL FIELD

The present invention relates to a superconducting magnet device and a method for manufacturing the superconducting magnet device.

BACKGROUND ART

As recited in JP 2013-31658A, conventionally known as a superconducting magnet device is a device provided with a magnet assembly including a superconducting coil, and a vacuum container which houses the magnet assembly.

The magnet assembly includes the superconducting coil, a refrigerant container which houses the superconducting coil together with a refrigerant such as liquid helium, and a heat-shield which covers the entire refrigerant container to shield heat radiation from the outside to the refrigerant container.

The magnet assembly should be supported while being suspended in the air within the vacuum container without contact with the vacuum container in order to suppress intrusion of heat from the vacuum container into the magnet assembly. The magnet assembly, however, includes the superconducting coil and the refrigerant container and is accordingly very heavy. Therefore, it is necessary to conceive a supporting structure of a magnet assembly, the structure being capable of simultaneously realizing reception of a heavy weight and suppression of intrusion of heat from the vacuum container to the magnet assembly.

For example, a possible supporting structure is a combination of a supporting member with high strength which is fixed to a vacuum container and is made of stainless or the like with flexural rigidity that allows reception of heavy weight of a magnet assembly, and a connecting member with low thermal conductivity which connects the supporting member and the magnet assembly.

However, since the supporting member receiving heavy weight requires a size for ensuring rigidity, down-sizing of the supporting member is difficult. Accordingly, for housing such a supporting member as receiving a heavy weight within a vacuum container without interference with a magnet assembly, an internal space of the vacuum container is inevitably increased. This resultantly makes it difficult to reduce the vacuum container in size.

SUMMARY OF INVENTION

In view of such circumstances as described above, the present invention aims at providing a superconducting magnet device that enables down-sizing of a vacuum container.

As a solution of the above problem, a superconducting magnet device of the present invention includes a vacuum container having a tubular barrel portion; a magnet assembly including a superconducting coil, a refrigerant tank which houses the superconducting coil together with a refrigerant, and a radiation shield which houses the refrigerant tank, the magnet assembly being housed in the vacuum container; a supporting member fixed to the barrel portion and protruding beyond the barrel portion to the inside of the vacuum container; and a connecting portion which connects the magnet assembly and the supporting member to each other such that the magnet assembly is spaced apart from the barrel portion in the vacuum container, in which the connecting portion has thermal conductivity lower than thermal conductivity of the supporting member, and the supporting member receives weight of the magnet assembly via the connecting portion while protruding inwardly beyond at least an outer circumference surface of the radiation shield of the magnet assembly.

DESCRIPTION OF EMBODIMENTS

Figure 1:
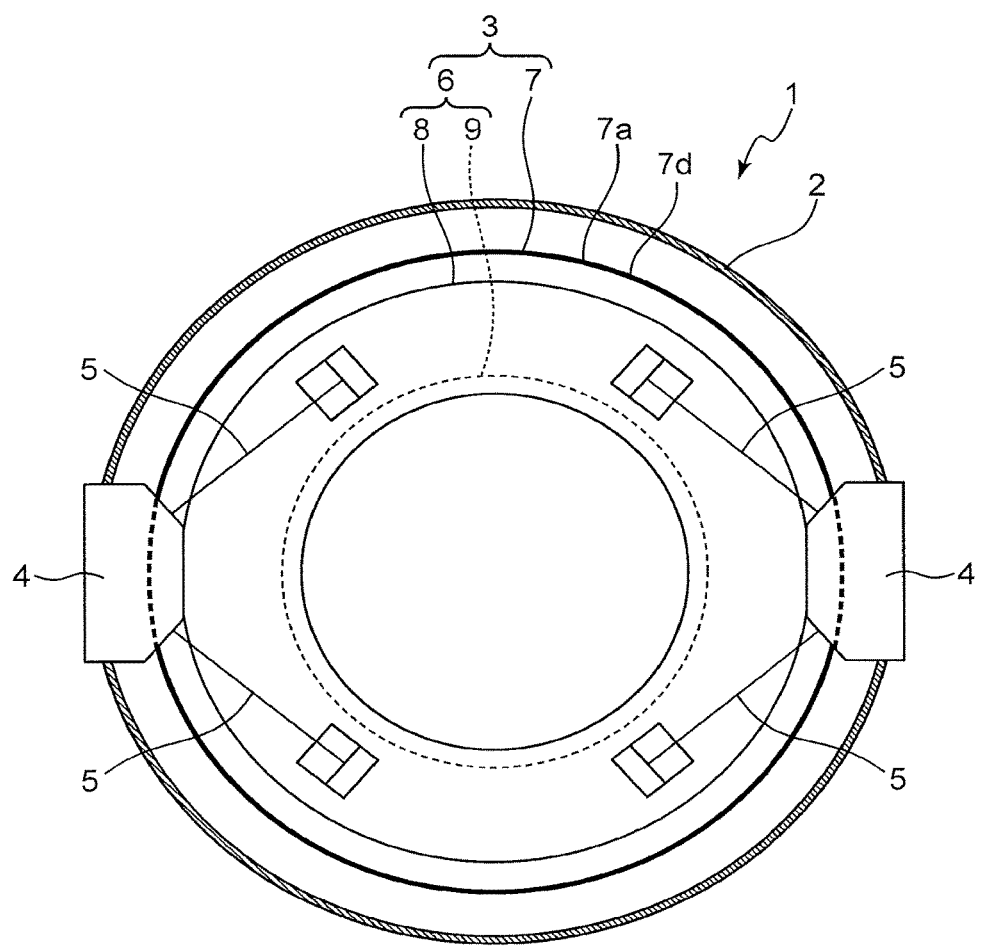
FIG. 1 is a view for schematically explaining a supporting structure of a magnet assembly in a superconducting magnet device according to an embodiment of the present invention.

With reference to the drawings, further detailed description will now be made of a superconducting magnet device and a method for manufacturing the superconducting magnet device according to an embodiment of the present invention.

As shown in FIGS. 1 to 5, a superconducting magnet device 1 of the present embodiment includes a vacuum container 2, a magnet assembly 3 housed in the vacuum container 2 (hereinafter, referred to simply as the assembly 3), a single (one) or a plurality (four in the present embodiment) of supporting blocks 4 functioning as a supporting member which receives weight of the assembly 3, a plurality of connecting portions 5 which connect the assembly 3 and the supporting block 4, tension rods 10, and a stress dispersing plate 11 provided around each of the supporting blocks 4.

The vacuum container 2 is a highly airtight container made of stainless or the like. The vacuum container 2 has a tubular barrel portion 2a, and a pair of end plates 2b which close openings at both ends of the barrel portion 2a. The vacuum container 2 is disposed such that an axial direction Q of the tubular barrel portion 2a is parallel to a horizontal direction. The barrel portion 2a has through-holes 2c formed at opposite end portions of the assembly 3 in the axial direction Q of the barrel portion 2a and at positions opposed to each other in the horizontal direction, into which through-holes, the supporting blocks 4 are inserted, respectively.

In the present embodiment, the vacuum container 2 includes a tubular inner tube 2d provided at a central part of the vacuum container 2 so as to extend through in the axial direction Q. Therefore, the tubular barrel portion 2a, the inner tube 2d, and the pair of end plates 2b form a circular internal space 2e. The circular internal space 2e is maintained in a vacuum state by a vacuum pump, not shown, or the like.

The assembly 3 is housed in the circular internal space 2e of the vacuum container 2. The assembly 3 includes a magnet main body 6 having a superconducting coil 9 and a helium tank 8, and a radiation shield 7 which houses the magnet main body 6.

The superconducting coil 9 includes a spool and a wire rod made of a superconducting material wound around the spool. The superconducting coil 9 is cooled by liquefied helium, to be described later, to a very low temperature (about 4 K) and used in a superconducting state, thereby generating a high magnetic field.

The helium tank 8 is a refrigerant tank which houses liquefied helium together with the superconducting coil 9. The liquefied helium is a refrigerant which cools the superconducting coil 9 to a very low temperature. Any other refrigerant can be used, than liquefied helium, which is capable of cooling the superconducting coil 9 to low temperature until the coil enters the superconducting state.

The helium tank 8 has a tubular tank main body 8a having an outer circumference surface on an inner side of the radiation shield 7 so as to extend in the axial direction Q of the barrel portion 2a, a pair of end plates 8b which close openings at both ends of the tank main body 8a, and a connecting projection 8c as a projection portion which protrudes beyond the outer circumference surface of the tank main body 8a toward the radiation shield 7.

By housing the helium tank 8, the radiation shield 7 shields the helium tank 8 from external heat radiation. The radiation shield 7 is manufactured of such a material as aluminium that is capable of shielding heat radiation.

The radiation shield 7 has a tubular shield main body 7a disposed to extend in the axial direction Q, and a pair of end plates 7b which close openings at both ends of the shield main body 7a.

Figure 2:
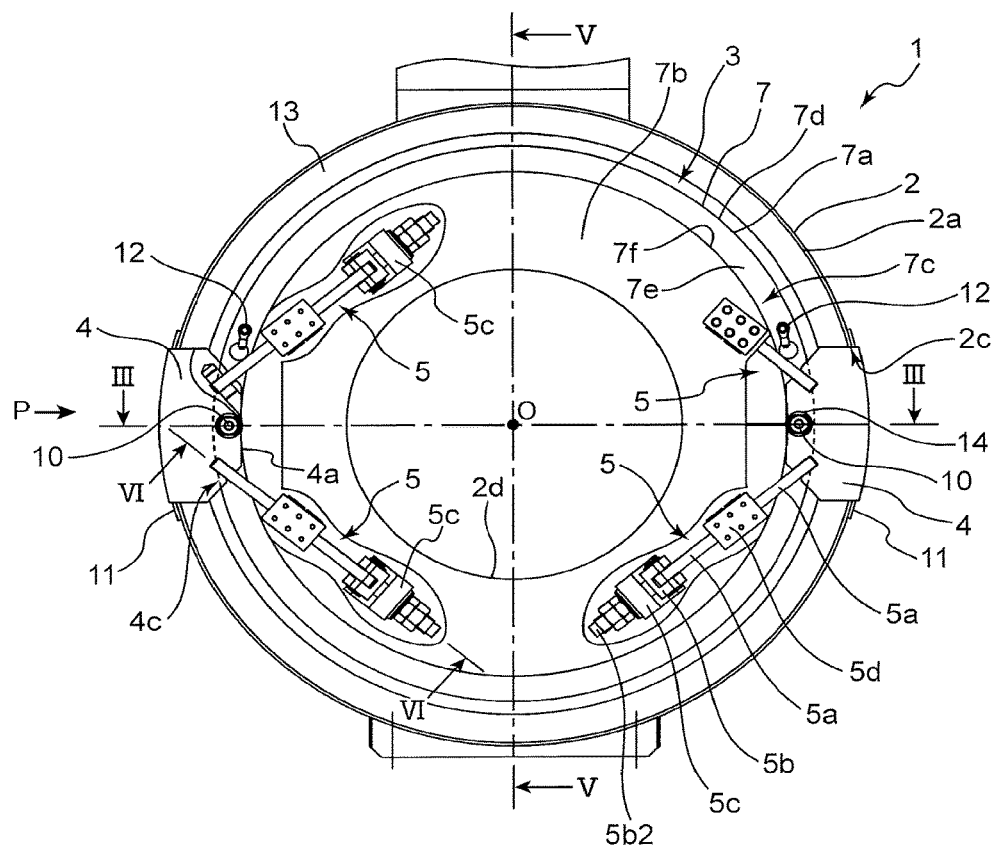
FIG. 2 is a front view showing an internal structure of a vacuum container in the superconducting magnet device including the supporting structure in FIG. 1, in which an end plate of a radiation shield is partially cut away.
Figure 3:
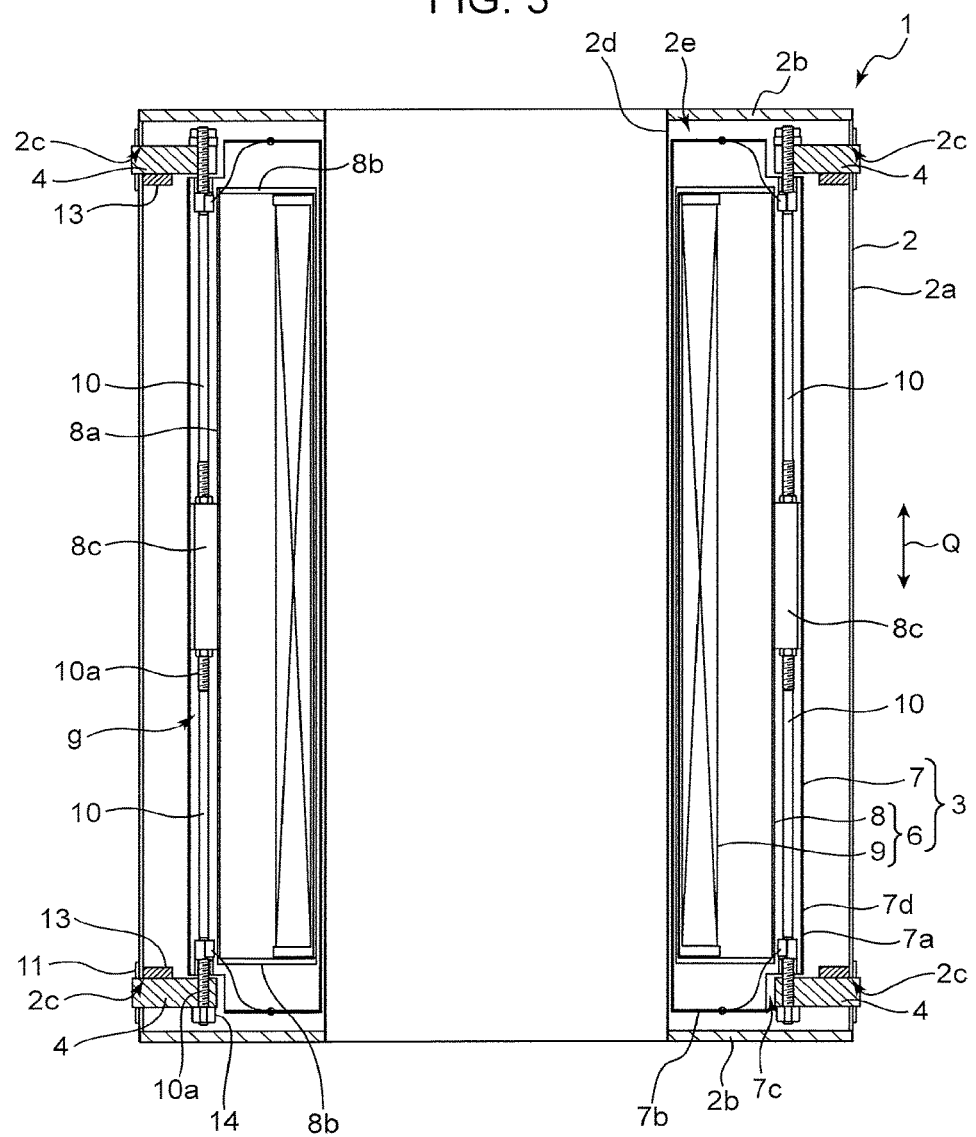
FIG. 3 is a sectional view taken along line III-III in FIG. 2.
Figure 4:
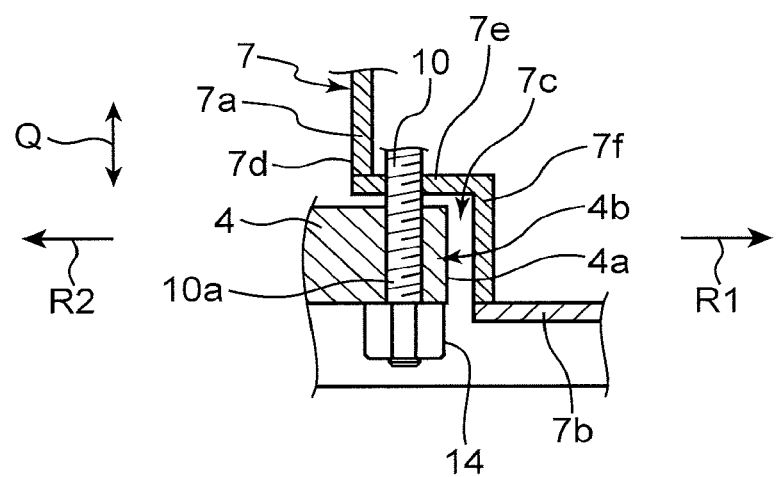
FIG. 4 is an enlarged view showing a part of a supporting member which is inserted into a recessed portion at an end portion of the radiation shield in an axial direction, the part being shown in FIG. 3.
Figure 5:
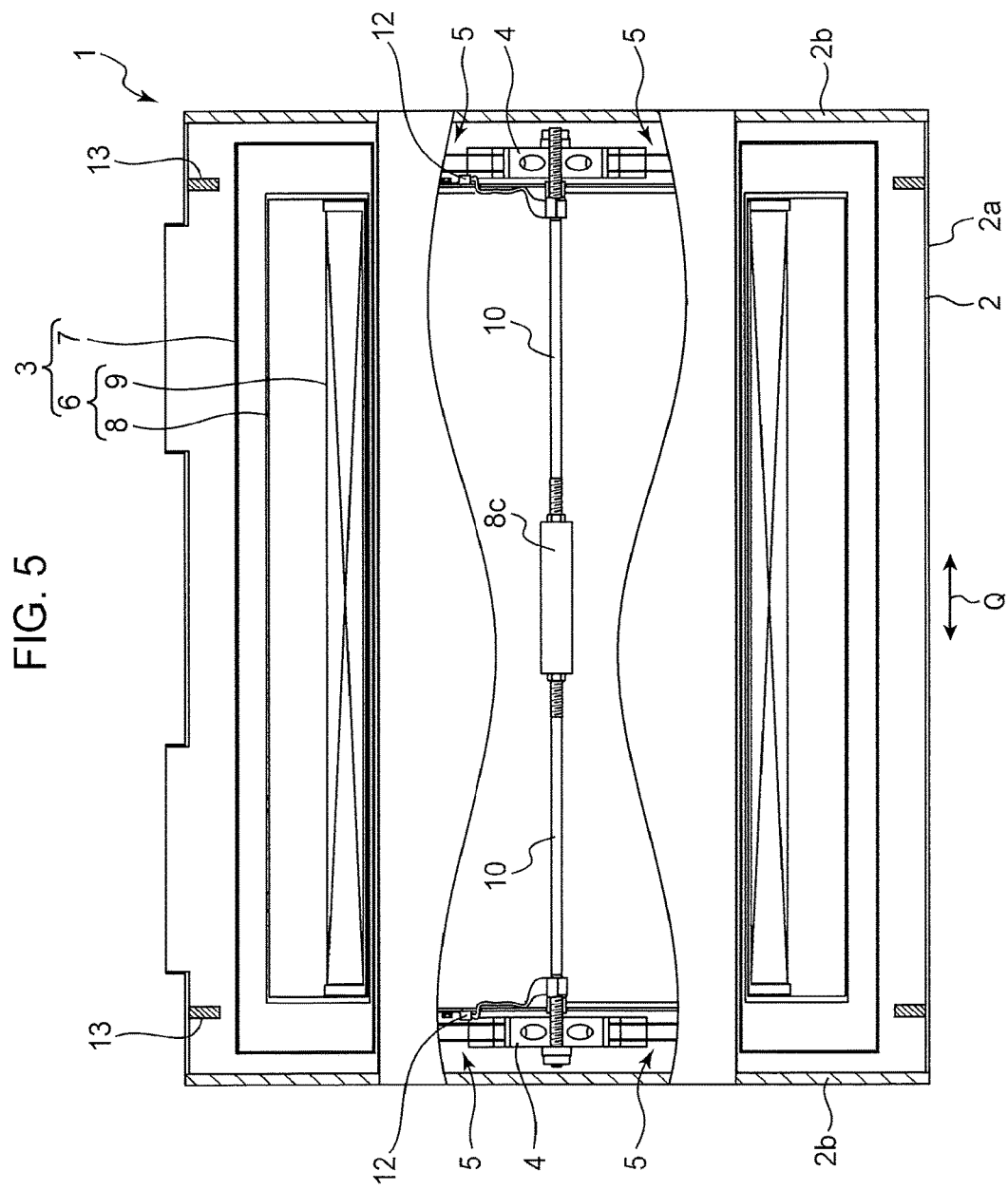
FIG. 5 is a sectional view taken along line V-V in FIG. 2.

As shown in FIGS. 2 to 4, the shield main body 7a has recessed portions 7c at opposite end portions in the axial direction Q, the recessed portions 7c being recessed inwardly from an outer circumference surface of the shield main body 7a. For forming the recessed portion 7c, the shield main body 7a has a first wall 7e and a second wall 7f. The first wall 7e extends inwardly (in a direction indicated by an arrow R1 in FIG. 4) from the end portion of the shield main body 7a and faces the axial direction Q. The second wall 7f extends in the axial direction Q so as to connect an end portion of the first wall 7e and an end portion of the end plate 7b and faces radially to the outside of the shield main body 7a (in a direction indicated by an arrow R2 in FIG. 4). The recessed portion 7c formed by the first wall 7e and the second wall 7f is open to the axial direction Q and radially to the outside (the direction indicated by the arrow R2).

As shown in FIG. 2, to the first wall 7e, a terminal 12 is disposed which is thermally connected to the radiation shield 7 and the superconducting coil 9 in the helium tank 8.

Figure 10:
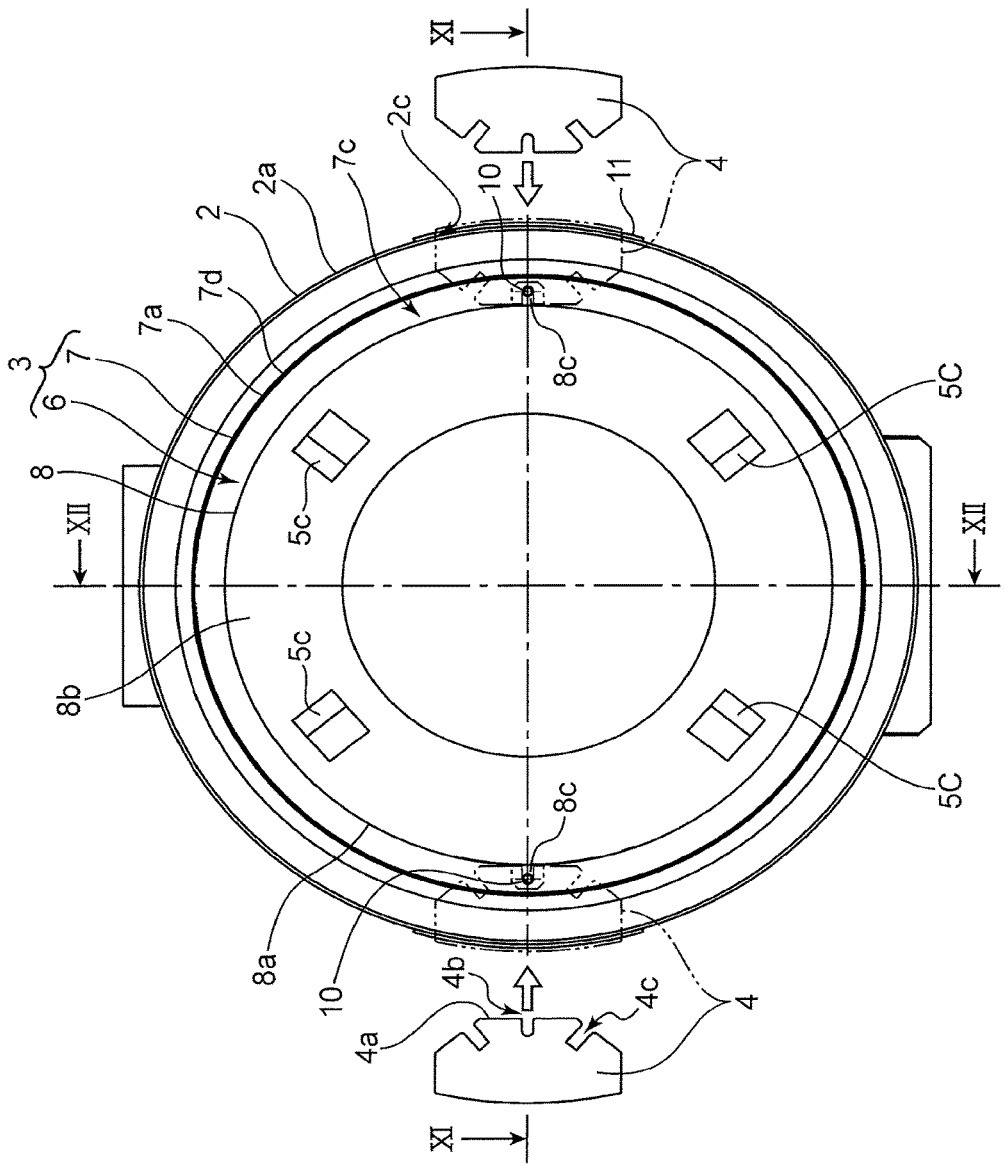
FIG. 10 is a view for explaining a step of inserting a supporting member in the method for manufacturing a superconducting magnet device according to the embodiment of the present invention.

For functioning as a supporting member which receives weight of the assembly 3, the supporting block 4 is a thick plate-shaped or rectangular solid member manufactured of a material having high flexural rigidity and tensile rigidity, e.g., a metal material such as a stainless alloy. The supporting block 4 has, as shown in FIGS. 2 and 10, a front end 4a, a recessed portion 4b formed at the front end 4a, and an attachment portion 4c to which a connecting portion 5 is attached. The recessed portion 4b has a width larger than an outer diameter of the tension rod 10 so as to allow insertion of the tension rod 10. The attachment portion 4c has a recessed portion of a size that allows insertion of an end portion of the connecting portion 5 (specifically, an end portion of a racetrack 5a to be described later).

The supporting blocks 4 are fixed to the barrel portion 2a of the vacuum container 2. Specifically, the supporting blocks 4 are provided at opposite end portions of the assembly 3 in the axial direction Q and disposed on both right and left sides with an axial center O of the vacuum container 2 (see FIG. 2) provided therebetween, so as to protrude beyond the barrel portion 2a to the inside of the vacuum container 2 through the through-hole 2c of the barrel portion 2a. In this state, the supporting block 4 is fixed to the barrel portion 2a by welding or the like. As shown in FIGS. 2 to 4, as a result of insertion of the front end 4a of the supporting block 4 into the recessed portion 7c of the shield main body 7a of the radiation shield 7, the supporting block 4 is disposed so as to protrude inwardly beyond an outer circumference surface 7d of the shield main body 7a. The supporting block 4 can be disposed not only at both the right and left sides with the axial center O of the vacuum container 2 (see FIG. 2) provided therebetween, but also at both up and down sides with the axial center O of the vacuum container 2 provided therebetween or at other positions.

Figure 8:
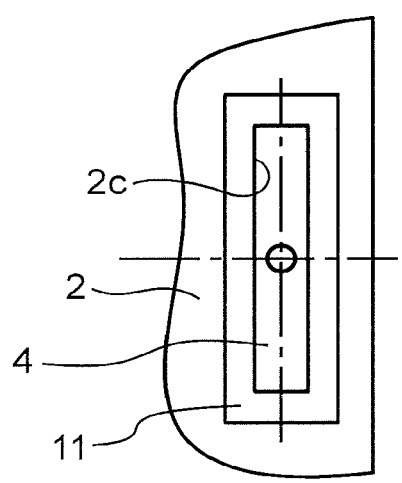
FIG. 8 is a view of the supporting member and surroundings thereof seen from a direction indicated by an arrow P in FIG. 2.

In the present embodiment, as shown in FIGS. 2 and 8, the stress dispersing plate 11 is provided around the supporting block 4. The stress dispersing plate 11 is a plate-shaped member made of metal such as stainless or the like and has a through-hole having the same shape and size as those of the through-hole 2c. The stress dispersing plate 11 is welded at an inner circumferential edge to the supporting block 4 and welded at an outer circumferential edge to the barrel portion 2a of the vacuum container 2.

As shown in FIGS. 1 and 2, each of the supporting blocks 4 is connected to the end portion of the assembly 3 in the axial direction Q via the two connecting portions 5.

The connecting portion 5 has a structure capable of connecting the assembly 3 and the supporting block 4 to each other such that the assembly 3 is positioned within the vacuum container 2 so as to be spaced apart from the barrel portion 2a. Further, since the connecting portion 5 has low thermal conductivity than thermal conductivity of the supporting block 4, heat conduction from the supporting block 4 to the assembly 3 is suppressed.

Figure 6:
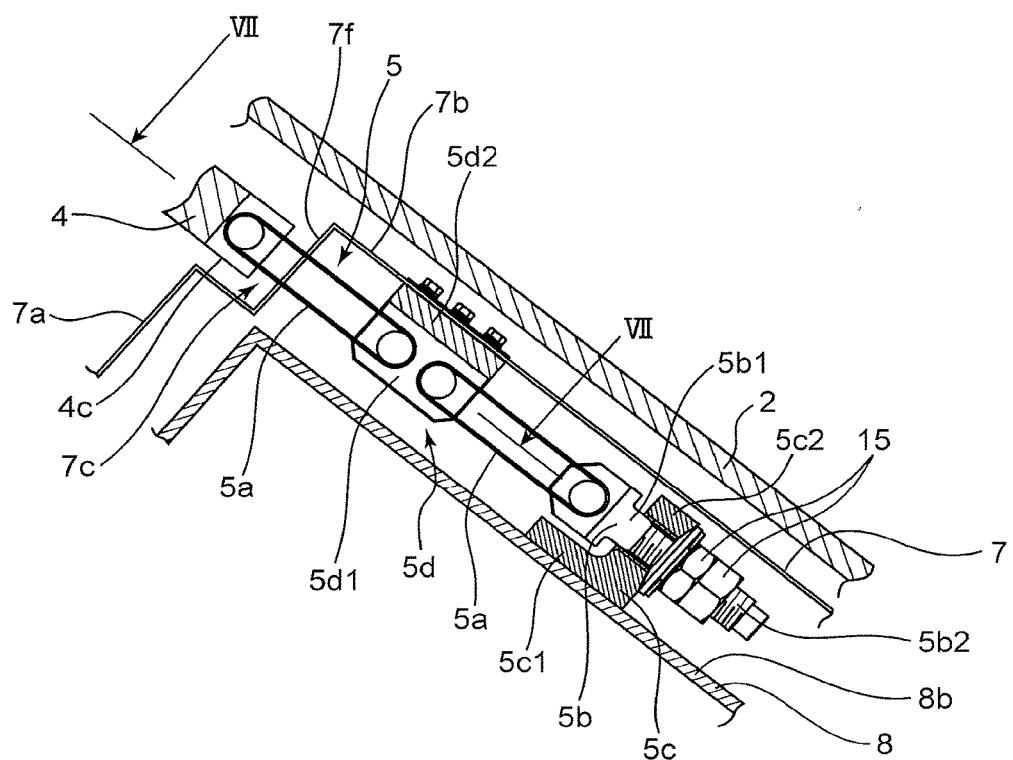
FIG. 6 is a sectional view taken along line VI-VI in FIG. 2.
Figure 7:
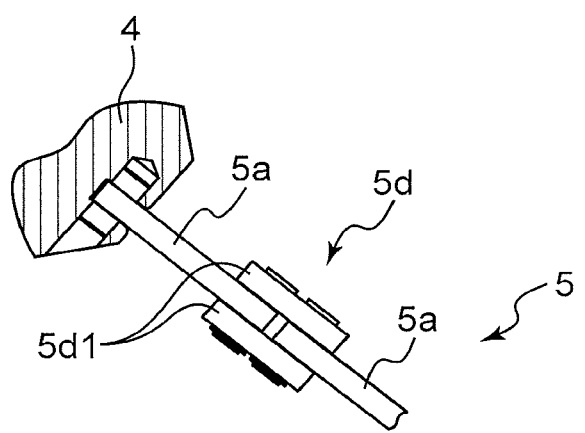
FIG. 7 is a sectional view taken along line VII-VII in FIG. 6.

Each connecting portion 5 specifically has the two endless belt-shaped racetracks 5a made of carbon fiber reinforced plastics (CFRP) or the like, a terminal member 5b, a pedestal portion 5c, and an intermediate member 5d as shown in FIGS. 2, 6 and 7. A large part of each connecting portion 5 excluding a part of the racetrack 5a is housed within the radiation shield 7 (specifically, as shown in FIG. 6, a gap between the end plate 7b of the radiation shield 7 and the end plate 8b of the helium tank 8) to connect the helium tank 8 of the assembly 3 and the supporting block 4.

The racetrack 5a is an endless belt-shaped member made of CFRP with thermal conductivity lower than that of a material (a stainless alloy or the like) of the supporting block 4. The two racetracks 5a are disposed in line in a longitudinal direction thereof and connected to each other via the intermediate member 5d.

The intermediate member 5d has a pair of opposed portions 5d1 spaced apart from each other to fix the racetrack 5a, and a flat plate portion 5d2 which connects the pair of opposed portions 5d1. In a gap between the pair of opposed portions 5d1, the end portion of the racetrack 5a is inserted and the racetrack 5a is fixed by a pin or the like so as not to be pulled out from the gap. The flat plate portion 5d2 is fixed to the end plate 7b of the radiation shield 7 by a bolt or the like. In this configuration, weight of the radiation shield 7 can be received by the supporting block 4 via the intermediate member 5d and the racetrack 5a.

An end portion of the serial racetrack 5a at the supporting block 4 side passes through the second wall 7f of the shield main body 7a of the radiation shield 7 (see FIGS. 4 and 6) to externally protrude beyond the radiation shield 7, and is connected to the attachment portion 4c of the supporting block 4 by a pin or the like. An end portion of the serial racetrack 5a at the assembly 3 side is attached to the terminal member 5b.

The terminal member 5b has a portion 5b1 connected to the racetrack 5a, and a male thread portion 5b2 as shown in FIG. 6.

The pedestal portion 5c is connected to the end plate 8b of the helium tank 8 as shown in FIGS. 2 and 6. The pedestal portion 5c has a leg portion 5c1 fixed to the end plate 8b, and a protrusion portion 5c2 protruding beyond the leg portion 5c1 to a direction separating from the end plate 8b. The leg portion 5c1 of the pedestal portion 5c is attached to the helium tank 8 in advance at the time of manufacture of the helium tank 8 by being fixed to the end plate 8b by welding or the like.

The male thread portion 5b2 of the terminal member a passes through the protrusion portion 5c2 of the pedestal portion 5c. Fastening a nut 15 to a front end of the male thread portion 5b2 results in connecting the terminal member 5b to the pedestal portion 5c. Tightening the nut 15 changes a position of the terminal member 5b relative to the pedestal portion 5c to enable adjustment of a tension of the racetrack 5a. Tightening peration of the nut 15 is conducted before the end plate 7b of the radiation shield 7 is attached.

As shown in FIG. 2, the four connecting portions 5 are disposed at the opposite end portions of the assembly 3 in the axial direction Q and around the axial center O of the vacuum container 2 so as to pull the assembly 3 toward a predetermined direction at different angles from each other. This enables the assembly 3 to be supported while being suspended in the air within the vacuum container 2 by using the four supporting blocks 4 and the eight connecting portions 5 at both ends in the axial direction Q.

The tension rod 10 is a member which extends in the axial direction Q of the tank main body 8a of the helium tank 8 for connecting the supporting block 4 and the connecting projection 8c of the helium tank 8. Specifically, the tension rod 10 extends in the axial direction Q in a gap g between the radiation shield 7 and the tank main body 8a (see FIG. 3). The tension rod 10 has male thread portions 10a at both end portions thereof. The male thread portion 10a at one end portion is screwed with a screw hole formed in the connecting projection 8c. As shown in FIGS. 3 and 4, a nut 14 is fastened in the state where the other male thread portion 10a passes through the first wall 7e facing the axial direction Q, in the recessed portion 7c of the radiation shield 7 to go out of the radiation shield 7, and also the other male thread portion 10a is inserted into the recessed portion 4b of the supporting block 4. This enables the tension rod 10 to function as an axial connecting member which connects the supporting block 4 and the connecting projection 8c while applying tension therebetween.

The tension rod 10 is manufactured of titanium, a titanium alloy, or the like. Titanium or a titanium alloy has higher flexural rigidity and tensile rigidity than glass fiber reinforced plastic (GFRP) for use in supporting a helium tank in a field of a conventional superconducting magnet device. Therefore, even when the tension rod 10, which is manufactured of titanium or a titanium alloy, is made thinner than a tension rod manufactured of GFRP, flexural rigidity and tensile rigidity thereof can be maintained.

As described above, the thus configured superconducting magnet device 1 of the present embodiment includes the supporting block 4 protruding beyond the barrel portion 2a of the vacuum container 2 to the inside of the vacuum container 2, and the connecting portion 5 which has thermal conductivity lower than that of the supporting block 4 and connects the assembly 3 and the supporting block 4 to each other such that the assembly 3 is spaced apart from the barrel portion 2a in the vacuum container 2. While the supporting block 4 protruding inwardly beyond at least the outer circumference surface 7d of the radiation shield 7 in the assembly 3, the supporting block 4 receives weight of the assembly 3 via the connecting portion 5. Therefore, within the vacuum container 2, a space in which the supporting block 4 can be housed is ensured. As a result, since an outer diameter of the tubular barrel portion 2a of the vacuum container 2 can be suppressed while ensuring an amount of inward protrusion beyond the vacuum container 2 as a size required for maintaining rigidity of the supporting block 4, down-sizing of the vacuum container 2 can be achieved.

In the present invention, since the supporting block 4 (supporting member) need only protrude inwardly beyond at least the outer circumference surface 7d of the radiation shield 7 in the assembly 3, the supporting block 4 can not only protrude inwardly beyond the outer circumference surface 7d of the radiation shield 7 but also protrude inwardly beyond the outer circumference surface of the helium tank 8. In this case, since the supporting block 4 protrudes inwardly beyond the outer circumference surface of the helium tank 8 housed in the radiation shield 7, a sufficient space in which the supporting block 4 can be housed is ensured within the vacuum container 2. As a result, the outer diameter of the tubular barrel portion 2a of the vacuum container 2 can be suppressed to enable further down-sizing of the vacuum container 2.

The superconducting magnet device 1 of the present embodiment has a configuration in which the barrel portion 2a has the through-hole 2c formed therein and the supporting block 4 protrudes beyond the barrel portion 2a to the inside of the vacuum container 2 through the through-hole 2c. Accordingly, it is possible to insert the assembly 3 in the tubular barrel portion 2a of the vacuum container 2 and then insert the supporting block 4 in the through-hole 2c of the barrel portion 2a, thereby arranging the supporting block 4 so as to protrude to the inside of the vacuum container 2 beyond the barrel portion 2a. Therefore, operation of inserting the assembly 3 into the barrel portion 2a of the vacuum container 2 can be conducted smoothly without interference with the supporting block 4.

The superconducting magnet device 1 of the present embodiment includes the stress dispersing plate 11 which connects a part around the through-hole 2c of the barrel portion 2a in the vacuum container 2 and the supporting block 4 to each other. Therefore, it is possible to disperse stress in a wide range, the stress being applied from the supporting block 4 to the part around the through-hole 2c in the barrel portion 2a of the vacuum container 2 via the stress dispersing plate 11.

Further, in the present embodiment, as shown in FIGS. 2 and 3, at a position in the vicinity of the through-hole 2c on an inner circumference surface of the barrel portion 2a, an internal reinforcing ring 13 is fixed to the inner circumference surface by welding or the like. The internal reinforcing ring 13 is a ring-shaped member manufactured of metal having high flexural rigidity such as stainless or the like. Accordingly, a part in the vicinity of the through-hole 2c of the barrel portion 2a is reinforced by the internal reinforcing ring 13, so that it is less likely to deform the barrel portion 2a due to a load on the supporting block 4 applied by the assembly 3.

In the superconducting magnet device 1 of the present embodiment, the supporting block 4 receives weight of the assembly 3 via the connecting portion 5 while protruding inwardly beyond the outer circumference surface 7d of the radiation shield 7 in the assembly 3 at the positions of the end portions at both ends of the assembly 3 in the axial direction Q of the barrel portion 2a. Accordingly, the supporting block 4 is allowed to stably support the assembly 3 by receiving the weight of the assembly 3 in the axial direction Q of the barrel portion 2a of the vacuum container 2 from both sides of the assembly 3.

In the superconducting magnet device 1 of the present embodiment, the radiation shield 7 has the tubular shield main body 7a disposed so as to extend in the axial direction Q. The shield main body 7a, at the opposite end portions in the axial direction Q, has the recessed portion 7c (see FIGS. 2 to 4) which is inwardly recessed from the outer circumference surface of the shield main body 7a. The supporting block 4 protrudes inwardly beyond the outer circumference surface 7d of the radiation shield 7 as a result of insertion of a front end of the supporting block 4 into the recessed portion 7c. Therefore, as a result of insertion of the front end of the supporting block 4 into the recessed portion 7c formed at the end portion in the axial direction of the tubular shield main body 7a of the radiation shield 7 (the same direction as the axial direction Q), the supporting block 4 is disposed at a position overlapping with the radiation shield 7 in the axial direction Q of the barrel portion 2a in the vacuum container 2. This enables reduction in length of the vacuum container 2 in the axial direction to enhance down-sizing of the vacuum container 2.

In the present invention, arrangement of the supporting block 4 is not limited to a position overlapping with the radiation shield 7 in the axial direction Q of the barrel portion 2a in the vacuum container 2 as described above. For example, the supporting block 4 can be disposed at a position apart from the radiation shield 7 in the axial direction Q.

In the superconducting magnet device 1 of the present embodiment, as described above, the supporting block 4, which is configured to protrude inwardly beyond the outer circumference surface 7d of the radiation shield 7, is connected to the connecting projection 8c protruding beyond the outer circumference surface of the tank main body 8a of the helium tank 8 via the tension rod 10 extending in the axial direction Q in the gap g between the radiation shield 7 and the tank main body 8a of the helium tank 8. This enables the supporting block 4 to fix the helium tank 8 via the tension rod 10 while regulating displacement in the above axial direction Q. Besides, it is not necessary to provide, independently of the supporting block 4, a new block for fixing the tension rod 10 in the vacuum container 2, so that an effect on down-sizing of the vacuum container 2 can be suppressed.

In the superconducting magnet device 1 of the present embodiment, use of the tension rod 10 made of titanium or a titanium alloy enables support of the helium tank 8 having a heavy weight even when the rod is made thinner than a member made of the above GFRP or the like. This achieves down-sizing of the vacuum container 2 while avoiding interference between the vacuum container 2 and the tension rod 10.

Next, a method for manufacturing the superconducting magnet device 1 of the present embodiment will be described.

First, prepared are the assembly 3 including the superconducting coil 9, helium tank 8, and radiation shield 7, and the vacuum container 2 having the tubular barrel portion 2a and having a total of four through-holes 2c formed at the end portions of the barrel portion 2a in the axial direction Q (preparation step). Here, as the vacuum container 2, a vacuum container is prepared in which to the through-hole 2c (see FIG. 8), the stress dispersing plate 11 is fixed, and to the inner circumference surface of the barrel portion 2a (see FIG. 5), the internal reinforcing ring 13 is fixed by welding or the like in advance. Additionally, as the helium tank 8, a helium tank is prepared in which to the end plate 8b, the pedestal portion 5c of the connecting portion 5 (see FIG. 10) is fixed by welding or the like in advance. The end plate 7b of the radiation shield 7 is left being taken out from the shield main body 7a.

In the above preparation step, the pair of end plates 2b blocking the openings on both sides of the barrel portion 2a of the vacuum container 2 are left unattached.

Figure 11:
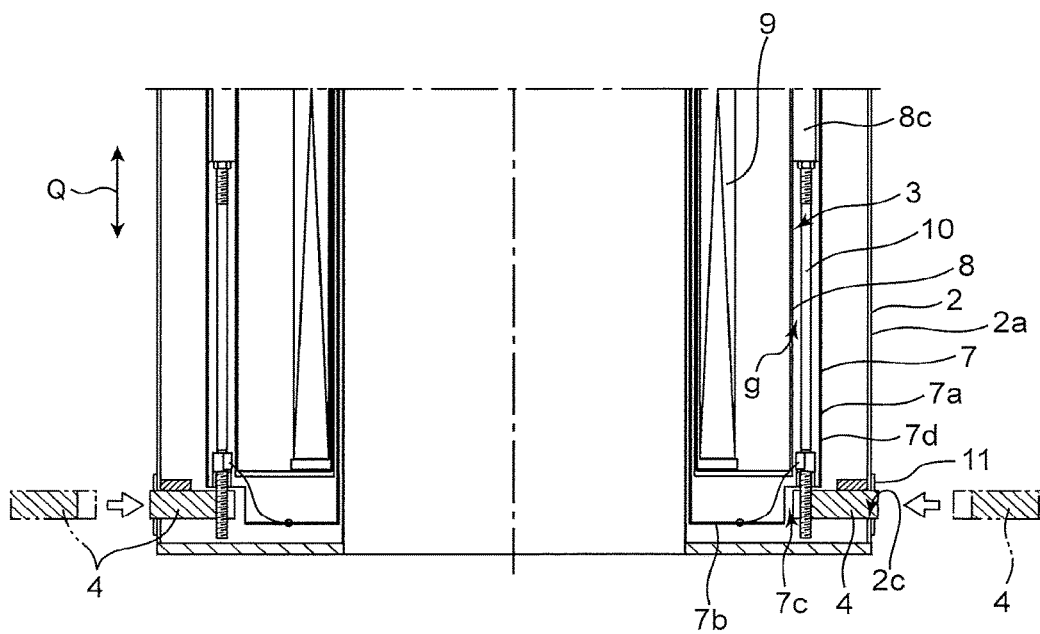
FIG. 11 is a sectional view taken along line XI-XI in FIG. 10.
Figure 12:
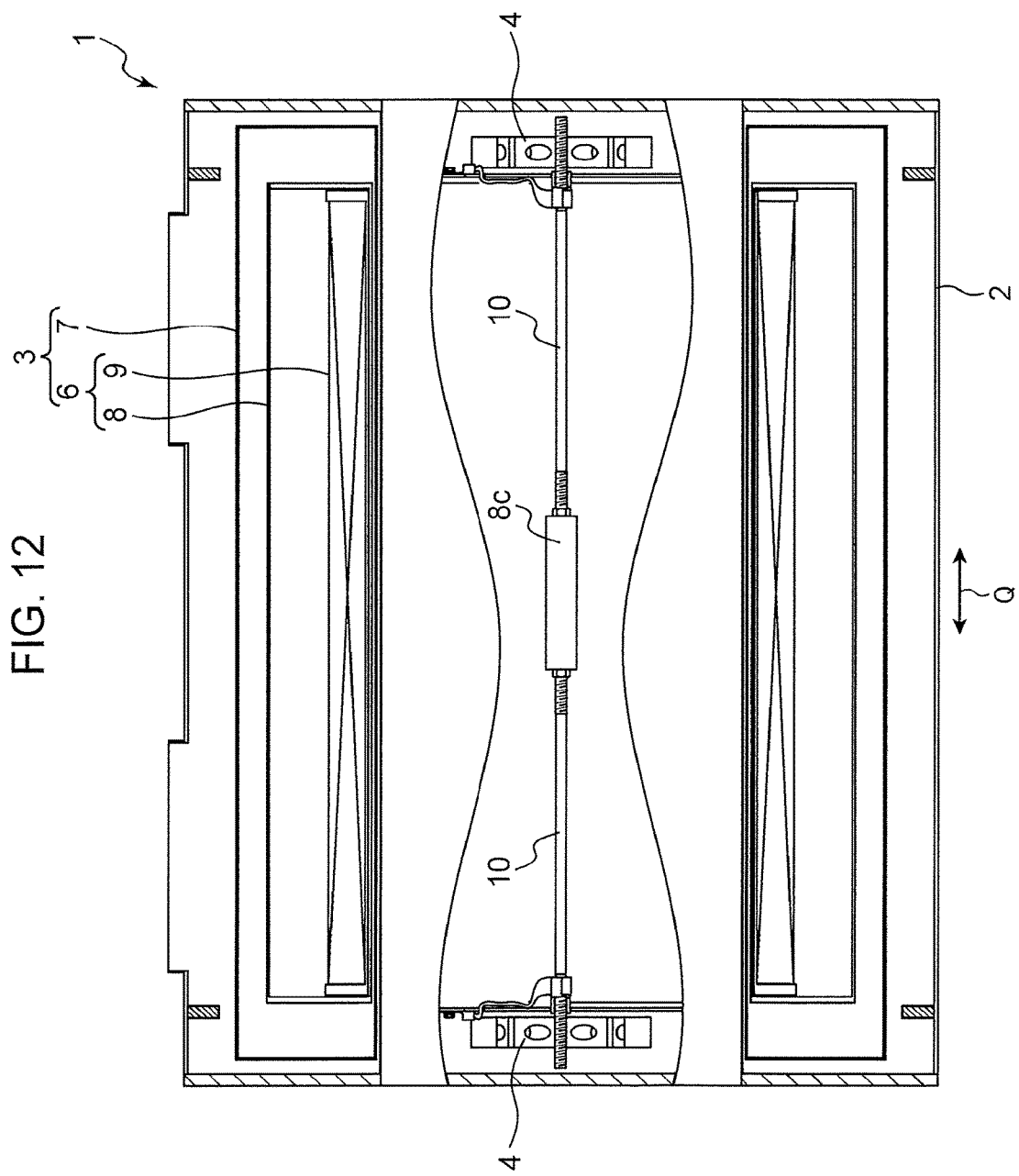
FIG. 12 is a sectional view taken along line XII-XI in FIG. 10.

Additionally, in the preparation step, the tension rod 10 is inserted in the gap g between the radiation shield 7 of the assembly 3 and the outer circumference surface of the helium tank 8 (see FIG. 11). Further, one of the male thread portions 10a of the tension rod 10 is screwed with the connecting projection 8c of the helium tank 8, and the other male thread portion 10a is exposed outside the radiation shield 7 after passing through the first wall 7e of the shield main body 7a of the radiation shield 7 (see FIG. 4).

Figure 9A:
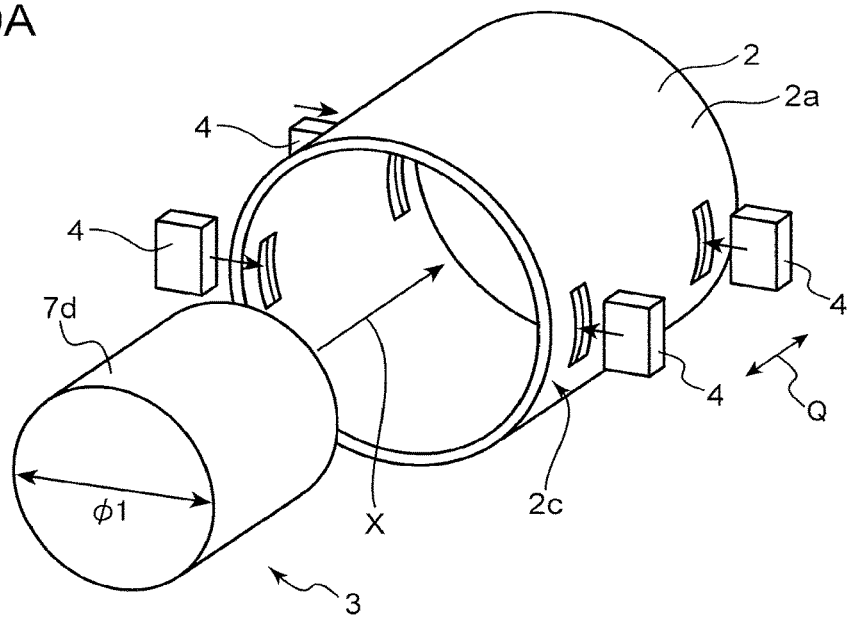
FIG. 9A is a view for explaining a procedure of a method for manufacturing a superconducting magnet device according to the embodiment of the present invention.

Subsequently, as shown in FIG. 9A, the assembly 3 is housed in the barrel portion 2a of the vacuum container 2 (the housing step). Specifically, the axial direction Q of the tubular barrel portion 2a of the vacuum container 2 is disposed to face the horizontal direction. Then, the assembly 3 is moved to the horizontal direction Q and is inserted into the barrel portion 2a of the vacuum container 2. At this time, the assembly 3 is maintained, within the barrel portion 2a of the vacuum container 2, at a position spaced apart from the barrel portion 2a such that an axial center of the assembly 3 and an axial center of the barrel portion 2a are coincident.

After the housing step, as shown in FIG. 9A, and FIGS. 10 to 12, the supporting block 4 is inserted into the through-hole 2c of the barrel portion 2a so as to protrude inwardly beyond at least an outer circumference surface of the radiation shield 7 (the supporting block insertion step). Specifically, the four supporting blocks 4 are respectively inserted into the four through-holes 2c formed at the end portions of the barrel portion 2a in the axial direction Q, and the front ends 4a of the supporting block 4 are inserted into the recessed portion 7c formed at both end portions in the axial direction Q of the shield main body 7a of the radiation shield 7. This enables the supporting block 4 to be disposed to protrude inwardly beyond the outer circumference surface 7d of the radiation shield 7.

When the supporting block 4 is inserted into the through-hole 2c, the male thread portion 10a of the tension rod 10 is simultaneously inserted into the recessed portion 4b of the supporting block 4. At this time, when the male thread portion 10a cannot be smoothly inserted into the recessed portion 4b due to a process error of the through-hole 2c or the like, the male thread portion 10a can be inserted with ease by fine adjustment of a position or an angle of the supporting block 4.

Thereafter, the supporting block 4 is fixed to the stress dispersing plate 11 by welding, the stress dispersing plate being attached to the barrel portion 2a of the container 2 in advance. Further, the inner circumference surface of the barrel portion 2a and the supporting block 4 are fixed by welding.

Subsequently, the assembly 3 and the supporting block 4 are connected through the connecting portion 5 to each other such that the assembly 3 is spaced apart from the barrel portion 2a in the vacuum container 2 (the connection step).

Specifically, with the end plate 7b of the radiation shield 7 detached, one end portion of the serial racetrack 5a of the connecting portion 5 is connected, by a pin or the like, to the attachment portion 4c of the supporting block 4 outside the radiation shield 7. On the other hand, inside the radiation shield 7, the terminal member 5b attached to the other end portion of the serial racetrack 5a is connected to the pedestal portion 5c fixed to the end plate 8b of the helium tank 8. Specifically, the male thread portion 5b2 of the terminal member 5b is tightened by the nut 15 through the protrusion portion 5c2 of the pedestal portion 5c. Adjustment of a tightening force of the nut 15 leads to adjustment of a tension of the connecting portion 5 (specifically, the racetrack 5a) which connects the assembly 3 and the supporting block 4. Thereafter, by the end plate 7b of the radiation shield 7, the opening at the end portion in the axial direction of the shield main body 7a of the radiation shield 7 is closed. Subsequently, the intermediate member 5d of the connecting portion 5 is fixed to the end plate 7b by a bolt or the like.

Subsequently, with the nut 14 screwed at a front end of the male thread portion 10a at an end portion of the tension rod 10, tightening the nut 14 leads to adjustment of a tension of the tension rod 10 which connects the supporting block 4 and the connecting projection 8c of the helium tank 8. The tension of the tension rod 10 stably supports the helium tank 8 in the axial direction Q. Before tension adjustment of the racetrack 5a, tension adjustment of the tension rod 10 can be conducted.

Lastly, by fixing the end plate 2b of the vacuum container 2 to both ends in the axial direction Q of the barrel portion 2a by welding or the like, a series of the manufacturing steps of the superconducting magnet device 1 ends.

As described above, in the method for manufacturing the superconducting magnet device 1 of the present embodiment, after the assembly 3 is inserted into the tubular barrel portion 2a of the vacuum container 2 at the housing step, by inserting the supporting block 4 into the through-hole 2c of the barrel portion 2a at the supporting block insertion step, the supporting block 4 can be disposed to protrude to the inside of the vacuum container 2 from the barrel portion 2a. Therefore, the operation of inserting the assembly 3 into the barrel portion 2a of the vacuum container 2 can be conducted smoothly without interference with the supporting block 4. Besides, after the operation of inserting the assembly 3, the supporting block 4 and the assembly 3 can be overlapped with each other in the radial direction of the barrel portion 2a.

Additionally, by inserting the supporting block 4 into the through-hole 2c of the barrel portion 2a of the vacuum container 2 so as to protrude inwardly beyond at least the outer circumference surface 7d of the radiation shield 7 of the assembly 3, the outer diameter of the tubular barrel portion 2a of the vacuum container 2 can be suppressed while ensuring an amount of inward protrusion beyond the vacuum container 2 as a size required for maintaining rigidity of the supporting block 4, so that down-sizing of the vacuum container 2 can be achieved.

For example, as shown in FIG. 9A, according to the method for manufacturing the superconducting magnet device 1 of the present embodiment, after inserting the assembly 3 with an outer diameter 411 into the tubular barrel portion 2a of the vacuum container 2, the supporting block 4 is allowed to, at the opposite end portions in the axial direction Q of the assembly 3, pass through the through-hole 2c of the barrel portion 2a to protrude inwardly beyond an outer circumference surface of the assembly 3 (i.e., the outer circumference surface 7d of the radiation shield 7)(i.e., to allow the supporting block 4 and the assembly 3 to overlap with each other). This enables assembly of the device 1 while avoiding interference between the supporting block 4 and the assembly 3. Accordingly, the outer diameter of the tubular barrel portion 2a of the vacuum container 2 can be reduced while ensuring the amount of inward protrusion of the supporting block 4 toward the inner side.

Figure 9B:
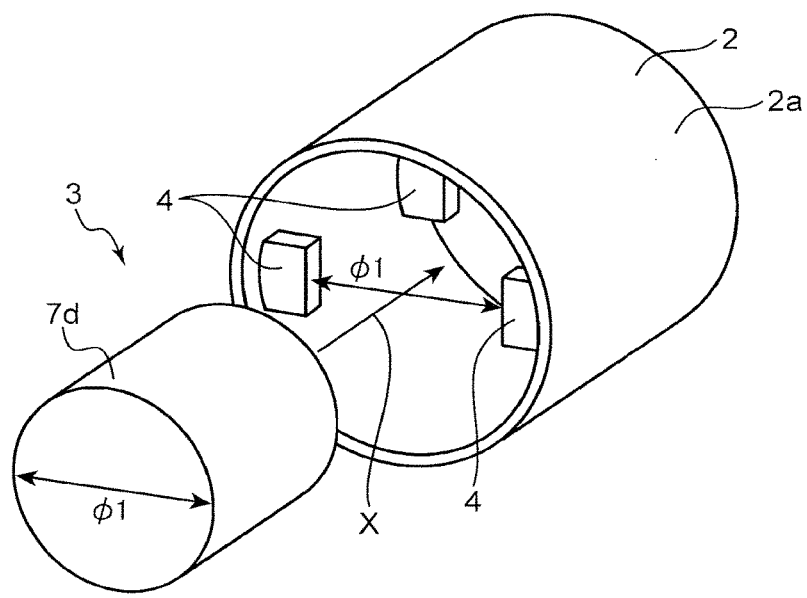
FIG. 9B is a view for explaining, as a comparative example of the manufacturing method according to the present invention, a step of inserting a magnet assembly into a vacuum container, with a supporting member welded to the inside of the vacuum container in advance.

On the other hand, a possible manufacturing method as a comparative example of the manufacturing method of the present invention, as shown in FIG. 9B, includes fixing the four supporting blocks 4 to the tubular barrel portion 2a of the vacuum container 2 by welding or the like in advance and inserting the same assembly 3 with the outer diameter φ1 as described above into the barrel portion 2a. In this comparative example of the manufacturing method, for inserting the assembly 3 with the outer diameter φ1 into the barrel portion 2a of the vacuum container 2 while avoiding interference with the supporting block 4, an inner diameter of the barrel portion 2a should be set to be larger than a sum of the outer diameter φ1 of the assembly and lengths of the protrusions of the supporting blocks 4 at both the right and left sides. Therefore, it is understood that ensuring an amount of inward protrusion of the supporting block 4 and reducing the outer diameter of the tubular barrel portion 2a of the vacuum container 2 are difficult to realize at the same time.

It is understood that as compared with the above comparative example in FIG. 9B, with the method of the present embodiment shown in FIG. 9A, by attaching the supporting block 4 so as to protrude inwardly beyond the outer circumference surface of the assembly 3 after the assembly 3 is housed in the barrel portion 2a, ensuring an amount of inward protrusion of the supporting block 4 and reduction in the outer diameter of the tubular barrel portion 2a of the vacuum container 2 can be both realized to enable down-sizing of the vacuum container 2.

The above-described specific embodiments mainly include inventions having the following configurations.

The superconducting magnet device of the above embodiment includes a vacuum container having a tubular barrel portion; a magnet assembly including a superconducting coil, a refrigerant tank which houses the superconducting coil together with a refrigerant, and a radiation shield which houses the refrigerant tank, the magnet assembly being housed in the vacuum container; a supporting member fixed to the barrel portion and protruding beyond the barrel portion to the inside of the vacuum container; and a connecting portion which connects the magnet assembly and the supporting member to each other such that the magnet assembly is spaced apart from the barrel portion in the vacuum container, in which the connecting portion has thermal conductivity lower than thermal conductivity of the supporting member, and the supporting member receives weight of the magnet assembly via the connecting portion while protruding inwardly beyond at least an outer circumference surface of the radiation shield of the magnet assembly.

In this configuration, protruding the supporting member, which receives weight of the magnet assembly within the vacuum container, inwardly beyond at least the outer circumference surface of the radiation shield of the magnet assembly allows the vacuum container to have a reduced diameter while ensuring a size required for maintaining rigidity of the supporting member. Specifically, for supporting the magnet assembly including the superconducting coil and refrigerant tank so as to be suspended in the air within the vacuum container, the supporting member which receives weight of the magnet assembly is provided within the vacuum container. Since the supporting member needs flexural rigidity enough to receive weight of the magnet assembly, it is necessary to ensure a size that allows the flexural rigidity to be obtained. Additionally, since for suppressing intrusion of heat from the supporting member to the magnet assembly, the supporting member should avoid contact with the magnet assembly, the supporting member and the magnet assembly are connected through the connecting portion having thermal conductivity lower than that of the supporting member. In such a supporting structure, according to the above configuration, since the supporting member receives weight of the magnet assembly via the connecting portion while protruding inwardly beyond at least the outer circumference surface of the radiation shield of the magnet assembly, a space in which the supporting member can be housed is ensured within the vacuum container. As a result, while ensuring an amount of inward protrusion beyond the vacuum container as a size required for maintaining rigidity of the supporting member, the outer diameter of the tubular barrel portion of the vacuum container can be reduced, thereby enabling down-sizing of the vacuum container.

It is preferable that the barrel portion has a through-hole formed therein, and the supporting member protrudes beyond the barrel portion to the inside of the vacuum container through the through-hole.

This configuration enables, after inserting the magnet assembly into the tubular barrel portion of the vacuum container, the supporting member to be inserted into the through-hole of the barrel portion and to be disposed to protrude to the inside of the vacuum container beyond the barrel portion. Therefore, it is possible to smoothly conduct operation of inserting the magnet assembly into the barrel portion of the vacuum container without interference with the supporting member.

The superconducting magnet device preferably further includes a surrounding connecting member which connects a part around the through-hole in the barrel portion and the supporting member to each other.

This configuration enables dispersion of stress in a wide range, the stress being applied from the supporting member to a part around the through-hole in the barrel portion of the vacuum container via the surrounding connecting member.

The supporting member preferably receives weight of the magnet assembly via the connecting portion while protruding inwardly beyond at least the outer circumference surface of the radiation shield of the magnet assembly at a position of each of opposite end portions of the magnet assembly in an axial direction of the barrel portion.

In this configuration, the supporting member is allowed to stably support the magnet assembly by receiving weight of the magnet assembly from both sides of the magnet assembly in an axial direction of the barrel portion of the vacuum container.

It is preferable that the radiation shield has a tubular shield main body disposed to extend in the axial direction, the shield main body has a recessed portion recessed inwardly beyond an outer circumference surface of the shield main body at each of opposite end portions in the axial direction, and the supporting member has a front end inserted into the recessed portion so as to protrude inwardly beyond the outer circumference surface of the radiation shield.

In this configuration, as a result of insertion of the front end of the supporting member into a recessed portion formed at the end portion in the axial direction of the tubular shield main body of the radiation shield, the supporting member is disposed at a position to overlap with the radiation shield in the axial direction of the barrel portion of the vacuum container. Therefore, the vacuum container can be further reduced in size by reducing a length in the axial direction of the vacuum container.

It is preferable that the refrigerant tank has a tubular tank main body which has an outer circumference surface on an inner side of the radiation shield so as to extend in an axial direction of the barrel portion, and a projection portion protruding beyond an outer circumference surface of the tank main body toward the radiation shield, the superconducting magnet device further including an axial connecting member which extends in the axial direction in a gap between the radiation shield and the tank main body and connects the supporting member and the projection portion.

In this configuration, with the supporting member protruding inwardly beyond the outer circumference surface of the radiation shield as described above, the supporting member is connected to the projection portion which protrudes beyond the outer circumference surface of the tank main body of the refrigerant tank via the axial connecting member extending in the axial direction in the gap between the radiation shield and the tank main body of the refrigerant tank. This enables the supporting member to be fixed with the refrigerant tank via the axial connecting member while regulating a displacement in the axial direction. Besides, since it is unnecessary to provide, independently of the supporting member, a new block for fixing the axial connecting member within the vacuum container, an effect on down-sizing of the vacuum container can be suppressed.

The axial connecting member is preferably made of titanium or a titanium alloy.

Since when the supporting member and the refrigerant tank are connected, the axial connecting member receives large flexural load and tensile load from the refrigerant tank having a heavy weight, the axial connecting member is required to have high tensile strength and flexural strength. Since as compared with a material such as glass fiber reinforced plastic (GFRP) or the like, titanium or a titanium alloy is excellent in flexural rigidity and tensile rigidity, use of an axial connecting member made of titanium or a titanium alloy, even when made thinner than the above member made of GFRP or the like, enables support of the refrigerant tank having a heavy weight. This realizes down-sizing of the vacuum container while avoiding interference between the vacuum container and the axial connecting member.

The supporting member preferably protrudes inwardly beyond the outer circumference surface of the refrigerant tank.

In this configuration, since the supporting member protrudes inwardly beyond the outer circumference surface of the refrigerant tank housed in the radiation shield, a space enough for housing the supporting member is ensured within the vacuum container. As a result, further down-sizing of the vacuum container is possible by further reducing the outer diameter of the tubular barrel portion of the vacuum container.

The method for manufacturing a superconducting magnet device of the present invention includes a preparation step of preparing a magnet assembly including a superconducting coil, a refrigerant tank which houses the superconducting coil together with a refrigerant, and a radiation shield which houses the refrigerant tank, and a vacuum container having a tubular barrel portion in which a through-hole is formed; a housing step of rendering the magnet assembly to be housed in the barrel portion of the vacuum container; a supporting member insertion step of inserting the supporting member into the through-hole of the barrel portion so as to protrude a part of the supporting member inwardly beyond at least an outer circumference surface of the radiation shield in the magnet assembly after the housing step; and a connection step of connecting the magnet assembly and the supporting member through a connecting portion to each other such that the magnet assembly is spaced apart from the barrel portion within the vacuum container.

The above manufacturing method enables, after inserting the magnet assembly in the tubular barrel portion of the vacuum container, the supporting member to be inserted into the through-hole of the barrel portion so as to be disposed to protrude to the inside of the vacuum container beyond the barrel portion. Therefore, it is possible to smoothly conduct operation of inserting the magnet assembly into the barrel portion of the vacuum container without interference with the supporting member. Besides, after the operation of inserting the magnet assembly, the supporting member and the magnet assembly can be overlapped with each other in an axial direction of the barrel portion. Additionally, by inserting the supporting member into the through-hole of the barrel portion of the vacuum container so as to protrude inwardly beyond at least the outer circumference surface of the radiation shield of the magnet assembly, the outer diameter of the tubular barrel portion of the vacuum container can be reduced while ensuring an amount of inward protrusion beyond the vacuum container as a size required for maintaining rigidity of the supporting member, so that down-sizing of the vacuum container can be achieved.

As described in the foregoing, the superconducting magnet device and the method for manufacturing the superconducting magnet device according to the present embodiment achieve down-sizing of a vacuum container.

Further, the method for manufacturing a superconducting magnet device of the present embodiment enables operation of inserting a magnet assembly into a barrel portion of a vacuum container to be conducted without interference with a supporting member and moreover, enables the supporting member and the magnet assembly to overlap with each other in an axial direction of the barrel portion.

This application is based on Japanese Patent application No. 2016-077885 filed in Japan Patent Office on Apr. 8, 2016, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The invention claimed is:

1. A superconducting magnet device comprising:
    a vacuum container having a tubular barrel portion;
    a magnet assembly including a superconducting coil, a refrigerant tank which houses the superconducting coil together with a refrigerant, and a radiation shield which houses the refrigerant tank, the magnet assembly being housed in the vacuum container;
    a supporting member fixed to the barrel portion and protruding beyond the barrel portion to the inside of the vacuum container; and
    a connecting portion which connects the magnet assembly and the supporting member to each other such that the magnet assembly is spaced apart from the barrel portion in the vacuum container,
    wherein the connecting portion has thermal conductivity lower than thermal conductivity of the supporting member, and
    the supporting member receives weight of the magnet assembly via the connecting portion while protruding inwardly beyond at least an outer circumference surface of the radiation shield of the magnet assembly.

2. The superconducting magnet device according to claim 1, wherein
    the barrel portion has a through-hole formed therein, and
    the supporting member protrudes beyond the barrel portion to the inside of the vacuum container through the through-hole.

3. The superconducting magnet device according to claim 2, further comprising a surrounding connecting member which connects a part around the through-hole in the barrel portion and the supporting member to each other.

4. The superconducting magnet device according to claim 1, wherein the supporting member receives weight of the magnet assembly via the connecting portion while protruding inwardly beyond at least the outer circumference surface of the radiation shield of the magnet assembly at a position of each of opposite end portions of the magnet assembly in an axial direction of the barrel portion.

5. The superconducting magnet device according to claim 4, wherein
    the radiation shield has a tubular shield main body disposed to extend in the axial direction,
    the shield main body has a recessed portion recessed inwardly from an outer circumference surface of the shield main body at each of opposite end portions in the axial direction, and
    the supporting member has a front end inserted into the recessed portion so as to protrude inwardly beyond the outer circumference surface of the radiation shield.

6. The superconducting magnet device according to claim 1, wherein
    the refrigerant tank has a tubular tank main body which has an outer circumference surface on an inner side of the radiation shield so as to extend in an axial direction of the barrel portion, and a projection portion protruding beyond an outer circumference surface of the tank main body toward the radiation shield, the superconducting magnet device further comprising:
an axial connecting member which extends in the axial direction in a gap between the radiation shield and the tank main body and connects the supporting member and the projection portion to each other.

7. The superconducting magnet device according to claim 6, wherein the axial connecting member is made of titanium or a titanium alloy.

8. The superconducting magnet device according to claim 1, wherein the supporting member protrudes inwardly beyond the outer circumference surface of the refrigerant tank.

9. The superconducting magnet device according to claim 2, wherein the supporting member receives weight of the magnet assembly via the connecting portion while protruding inwardly beyond at least the outer circumference surface of the radiation shield of the magnet assembly at a position of each of opposite end portions of the magnet assembly in an axial direction of the barrel portion.

10. The superconducting magnet device according to claim 3, wherein the supporting member receives weight of the magnet assembly via the connecting portion while protruding inwardly beyond at least the outer circumference surface of the radiation shield of the magnet assembly at a position of each of opposite end portions of the magnet assembly in an axial direction of the barrel portion.

11. The superconducting magnet device according to claim 2, wherein
the refrigerant tank has a tubular tank main body which has an outer circumference surface on an inner side of the radiation shield so as to extend in an axial direction of the barrel portion, and a projection portion protruding beyond an outer circumference surface of the tank main body toward the radiation shield, the superconducting magnet device further comprising:
an axial connecting member which extends in the axial direction in a gap between the radiation shield and the tank main body and connects the supporting member and the projection portion to each other.

12. The superconducting magnet device according to claim 3, wherein
the refrigerant tank has a tubular tank main body which has an outer circumference surface on an inner side of the radiation shield so as to extend in an axial direction of the barrel portion, and a projection portion protruding beyond an outer circumference surface of the tank main body toward the radiation shield, the superconducting magnet device further comprising:
an axial connecting member which extends in the axial direction in a gap between the radiation shield and the tank main body and connects the supporting member and the projection portion to each other.

13. The superconducting magnet device according to claim 2, wherein the supporting member protrudes inwardly beyond the outer circumference surface of the refrigerant tank.

14. The superconducting magnet device according to claim 3, wherein the supporting member protrudes inwardly beyond the outer circumference surface of the refrigerant tank.

15. A method for manufacturing a superconducting magnet device comprising:
a preparation step of preparing a magnet assembly including a superconducting coil, a refrigerant tank which houses the superconducting coil together with a refrigerant, and a radiation shield which houses the refrigerant tank, and a vacuum container having a tubular barrel portion in which a through-hole is formed;
a housing step of rendering the magnet assembly to be housed in the barrel portion of the vacuum container;
a supporting member insertion step of inserting the supporting member into the through-hole of the barrel portion so as to protrude a part of the supporting member inwardly beyond at least an outer circumference surface of the radiation shield in the magnet assembly after the housing step; and
a connection step of connecting the magnet assembly and the supporting member through a connecting portion to each other such that the magnet assembly is spaced apart from the barrel portion within the vacuum container.

* * * * *